(12) United States Patent
Smith

(10) Patent No.: US 7,026,878 B2
(45) Date of Patent: Apr. 11, 2006

(54) FLEXIBLE SYNTHESIZER FOR MULTIPLYING A CLOCK BY A RATIONAL NUMBER

(75) Inventor: Sterling Smith, Hsinchu (TW)

(73) Assignee: MStar Semiconductor, Inc., Hsin-Chu Hsien (TW)

( * ) Notice: Subject to any disclaimer, the term of this patent is extended or adjusted under 35 U.S.C. 154(b) by 19 days.

(21) Appl. No.: 10/711,175

(22) Filed: Aug. 30, 2004

(65) Prior Publication Data

US 2005/0046491 A1    Mar. 3, 2005

Related U.S. Application Data

(60) Provisional application No. 60/498,697, filed on Aug. 29, 2003.

(51) Int. Cl.
*H03L 7/18* (2006.01)

(52) U.S. Cl. .......................... 331/1 A; 331/16; 331/25; 327/156

(58) Field of Classification Search ........ 331/1 A, 331/16, 18, 25; 327/115, 117, 118, 156–159; 332/127; 360/51; 375/376; 455/26
See application file for complete search history.

(56) References Cited

U.S. PATENT DOCUMENTS

| | | |
|---|---|---|
| 2004/0032898 A1 | 2/2004 | Smith |
| 2004/0036509 A1 | 2/2004 | Smith |
| 2004/0052324 A1 | 3/2004 | Smith |
| 2005/0046491 A1* | 3/2005 | Smith ........................ 331/25 |

* cited by examiner

*Primary Examiner*—David Mis
(74) *Attorney, Agent, or Firm*—Winston Hsu

(57) ABSTRACT

A frequency synthesizer that includes two fractional dividers, two noise-shaped quantizers, three integer dividers, a PLL, an algorithm embodied in control logic, and an adjustment means. The noise-shaped quantizers are used to quantize two fractional (fixed-point) values, derived from the divider control words, into time-varying values. The dividers and PLL are used to generate an output signal by means of multiplying a reference signal by the quotient of the divider control word values. Accordingly, the frequency synthesizer of the present invention can provide a very precise output clock, with the average output frequency being the input frequency multiplied by the quotient of the two divider control words, and with high jitter stability.

56 Claims, 5 Drawing Sheets

FLEXIBLE SYNTHESIZER FOR MULTIPLYING A CLOCK BY A RATIONAL NUMBER

CROSS REFERENCE TO RELATED APPLICATIONS

The application claims the benefit of U.S. Provisional Application No. 60/498,697, filed Aug. 29, 2003, and included herein by reference.

BACKGROUND OF INVENTION

1. Field of the Invention

The present invention generally relates to a frequency synthesizer. More specifically, the present invention relates to a frequency synthesizer featuring high precision, wide bandwidth, low jitter, a broad frequency output range, and an integrated PLL with a limited oscillator frequency range.

2. Description of the Prior Art

Modern multimedia entertainment systems are placing ever increasing demands on the resolution, bandwidth, and switching speed of frequency synthesizers. In the past, these requirements have been satisfied by the conventional phase-locked loop (PLL) synthesizer. The fundamental advantage of PLLs has been their ability to synthesize an output clock signal of high spectral purity that may be tuned over a wide bandwidth. However, the switching speed and resolution of synthesizers are becoming critically important, and conventional PLLs are ill-suited to these applications because they suffer an inability to simultaneously provide fast frequency switching and high resolution without substantial design complexity.

Referring to FIG. 9, the classic analog PLL design comprises a phase detector 30C with two inputs and one output, which is connected to a charge pump 32C, which is in turn connected to a filter 34C, which in turn is connected to a variable-frequency oscillator 36C, which varies its frequency according to a control input. The oscillator's output is looped back through a divider 24C and into one input of the phase detector 30C, in addition to being output 62C from the circuit as a whole, optionally through a post divider 28C. The reference clock 60C is connected to the other input of the phase detector 30C, optionally through a reference clock divider 22C.

This classic design has several limitations when the input and feedback divisors are large values. First, the loop bandwidth must be significantly smaller than the phase detector input frequency in order to operate stably. Second, as a consequence of this, the filter components must be large, possibly requiring the use of external components. Third, the low bandwidth makes the PLL susceptible to noise, notably for example the standard 60 Hz power line noise. Fourth, the variable-frequency oscillator frequency limits the possible input and output frequencies of the circuit when the range of possible divisor values is large. Fifth, such a circuit may have high power consumption. Sixth, the use of external components drives up the cost of production and increases hardware space requirements.

SUMMARY OF INVENTION

It is therefore an objective of the present invention to provide a frequency synthesizer outputting a precision frequency when the input or feedback dividers are large numbers.

It is another objective of the present invention to provide a frequency synthesizer featuring low output clock jitter.

It is another objective of the present invention to provide a frequency synthesizer in which the output frequency range of the frequency synthesizer is maximized while the range of the variable-frequency oscillator in the PLL is minimized.

To attain these objectives, the claimed invention provides a frequency synthesizer that comprises a phase detector for generating an output according to a difference of a reference input and a feedback input, an oscillator coupled to the phase detector, the oscillator capable of outputting a variable frequency signal in response to a control input, a first divider module for generating the feedback input, the first divider module comprising a first fractional divider coupled to the oscillator for dividing a frequency of the variable frequency signal by a first time-varying value, and a second divider module for generating the reference input, the second divider module comprising a second fractional divider for dividing a frequency of a reference signal by a first time-varying value.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings that form a part hereof, and in which is shown by way of illustration specific preferred embodiments in which the invention may be practiced. The preferred embodiments are described in sufficient detail to enable those skilled in the art to practice the invention, and it is to be understood that other embodiments may be utilized and that logical changes may be made without departing from the spirit and scope of the present invention. The following detailed description is, therefore, not to be taken in a limiting sense, and the scope of the present invention is defined only by the appended claims.

Figure 1:
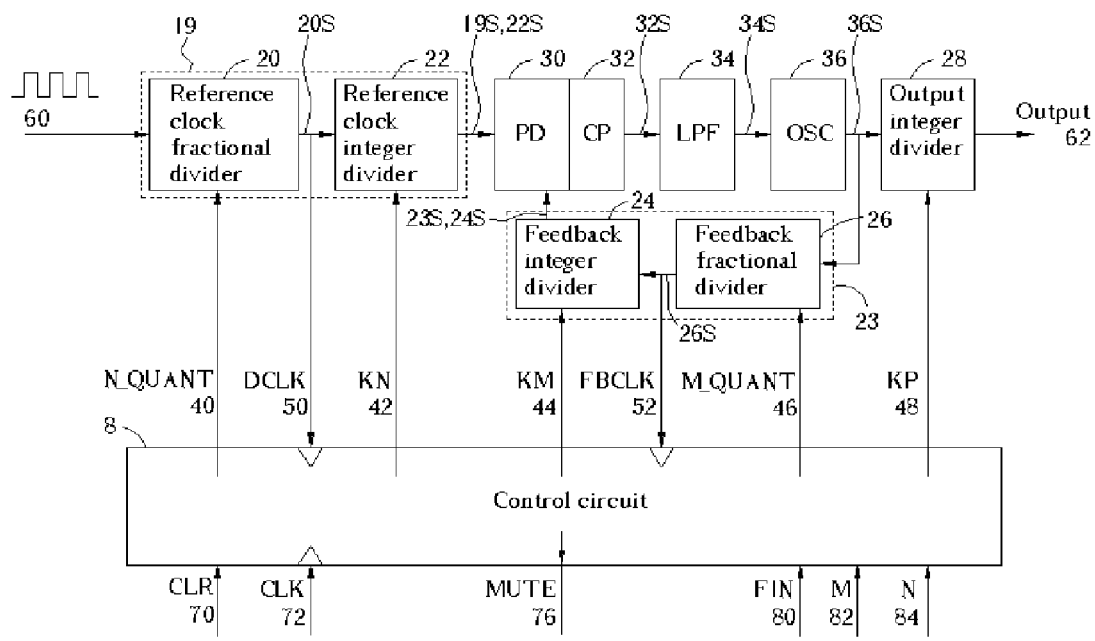
FIG. 1 schematically illustrates a block diagram of a frequency synthesizer in accordance with one preferred embodiment of the present invention.

Refer to FIG. 1, which illustrates a frequency synthesizer in accordance with one preferred embodiment of the present invention. The frequency synthesizer comprises a first divider module 23, a second divider module 19, a phase detector 30, a charge pump 32, a loop filter 34, a variable-frequency oscillator 36, an output integer divider 28, and a control circuit 8. The first divider module 23 comprises a feedback fractional divider 26 and a feedback integer divider 24. The second divider module 19 comprises a reference clock fractional divider 20 and a reference clock integer divider 22.

A reference clock 60 is coupled to the input of the reference clock fractional divider 20. The reference clock fractional divider 20 outputs a reference clock fractional divider signal 20S to the input of the reference clock integer divider 22. The output of the reference clock integer divider 22 is connected to the first input of a phase detector 30 for providing a reference input signal 22S,19S to the phase detector 30. The charge pump 32 generates a charge pump output 32S according to a phase difference or frequency difference of the reference input and a feedback input. The output of the charge pump 32 is connected to a loop filter 34 which removes high frequency components of the output of the charge pump. The loop filter 34 outputs a control input 34S to the oscillator 36, which is capable of outputting a variable frequency 36S in response to the control input for generating a clock signal. The oscillator 36 may be a voltage-controlled oscillator, a current-controlled oscillator, a numerically-controlled oscillator, a digitally controlled oscillator, or other type of oscillator capable of generating a variable frequency output 36S in response to a control input. The output of the oscillator 36 is connected to both the input of the output integer divider 28 and the input of the feedback fractional divider 26. The feedback fractional divider 26 outputs a feedback fractional divider output signal 26S to the input of the feedback integer divider 24. The feedback integer divider 24 outputs a feedback integer divider output signal 24S, 23S to the feedback input of the phase detector 30.

Referring again to FIG. 1, the input to the control circuit 8 comprises a reset CLR 70 which indicates that the synthesizer should be reset to an initial condition, a clock CLK 72 which indicates when the synthesizer should read a divider control word M 82 and a divider control word N 84, a frequency range indicator exponent value FIN 80 to indicate which frequency range the reference clock 60 falls in, a divider control word M 82, and a divider control word N 84.

The desired output frequency of the synthesizer embodiment is described by the formula $$f_{out} = \frac{M}{N} \times f_{in} \qquad (eq. 1)$$

where $f_{out}$ is the output frequency, $f_{in}$ is the input frequency, and M 82 and N 84 are the divider control words.

Figure 2:
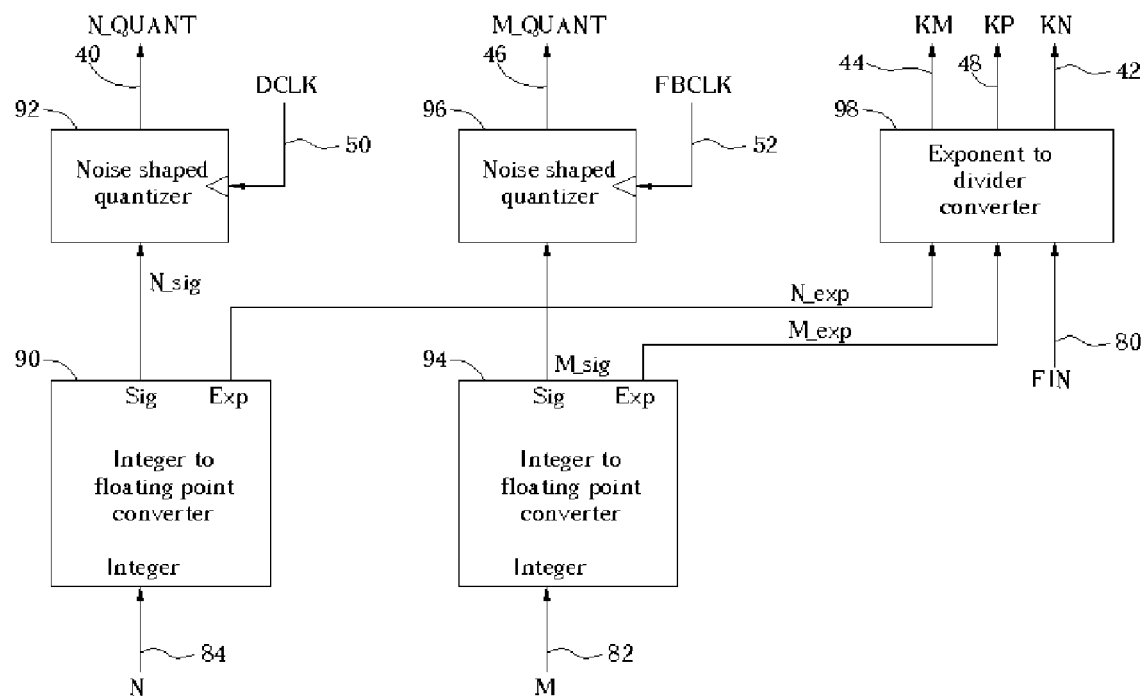
FIG. 2 illustrates a simplified block diagram of the control circuit, including the noise-shaped quantizers.

Refer to FIG. 2, which shows the block diagram of the control circuit 8, the main purpose of which is to convert the inputs M 82, N 84, and FIN 80 into the integer divider values for the integer dividers 22, 24, 28 and quantized divider value sequences for the fractional dividers 20, 26 to achieve the desired function described by (eq. 1). The divider control word M 82 undergoes an integer-to-floating-point conversion 94 which produces a significand of M M_SIG and an exponent of M M_EXP where the significand is within a preferred range. M_SIG is sent to a noise-shaped quantizer 96 which has a clock input FBCLK 52 which is taken from the output of the feedback fractional divider 26. On each cycle of the clock FBCLK 52, the quantizer 96 outputs a quantized value M_QUANT 46. The divider control word N 84 undergoes an integer-to-floating-point conversion 90 which produces a significand of N N_SIG and an exponent of N N_EXP, where the significand is within a preferred range. N_SIG is sent to a noise-shaped quantizer 92 which has a clock input DCLK 50 which is taken from the output of the reference clock fractional divider 20. On each cycle of the clock DCLK 50, the quantizer 92 outputs a quantized value N_QUANT 40. The preferred ranges for the N significand N_SIG and the M significand M_SIG are not necessarily the same.

M_EXP and N_EXP and FIN 80 are sent to an exponent-to-divider conversion 98. The exponent-to-divider conversion 98, which is illustrated in more detail in FIG. 7, outputs three integer values KM 44, KP 48, and KN 42.

Revisiting the earlier formula, this embodiment of the control circuit 8 reformulates the divider control words M 82 and N 84 and FIN 80 to produce the desired output of $$f_{out} = \frac{M}{N} \times f_{in} \qquad (eq. 1)$$

by computing values KM 44, KP 48, KN 42, N_sig, and M_sig such that the following equality is met:

$$f_{out} = \frac{1}{2^{KP}} \times 2^{KM} \times M_{sig} \times \frac{1}{2^{KP}} \times \frac{1}{N_{sig}} \times f_{in} = \frac{M}{N} \times f_{in} \qquad (eq. 2)$$

With simplified logic and less stringent requirements, the equality could be made approximate without departing from the spirit of the invention. The noise-shaped quantizers use a multi-bit 2nd order delta-sigma algorithm (as described in USPTO application 2004/0036509 by the same inventor, incorporated herein by reference). The noise-shaped quantizer 92 outputs the N_QUANT 40 signal which has an average value approaching the fixed-point significand N_sig. The noise-shaped quantizer 96 outputs the M_QUANT 46 signal which has an average value approaching the fixed-point significand M_sig. Therefore the average values of M_QUANT and N_QUANT can be substituted for M_sig and N_sig respectively, giving $$f_{out} = \frac{1}{2^{KP}} \times 2^{KM} \times \overline{M_{QUANT}} \times \frac{1}{2^{KM}} \times \frac{1}{\overline{N_{QUANT}}} \times f_{in} = \frac{M}{N} \times f_{in} \qquad (eq. 3)$$

Also note that in the embodiment of FIG. 1, the integer dividers 22, 24, and 28 are power-of-2 integer dividers (i.e., the reference clock integer divider 22 receives divider control signal KN and divides reference clock fractional divider signal 20S by $2^{KN}$).

Figure 3:
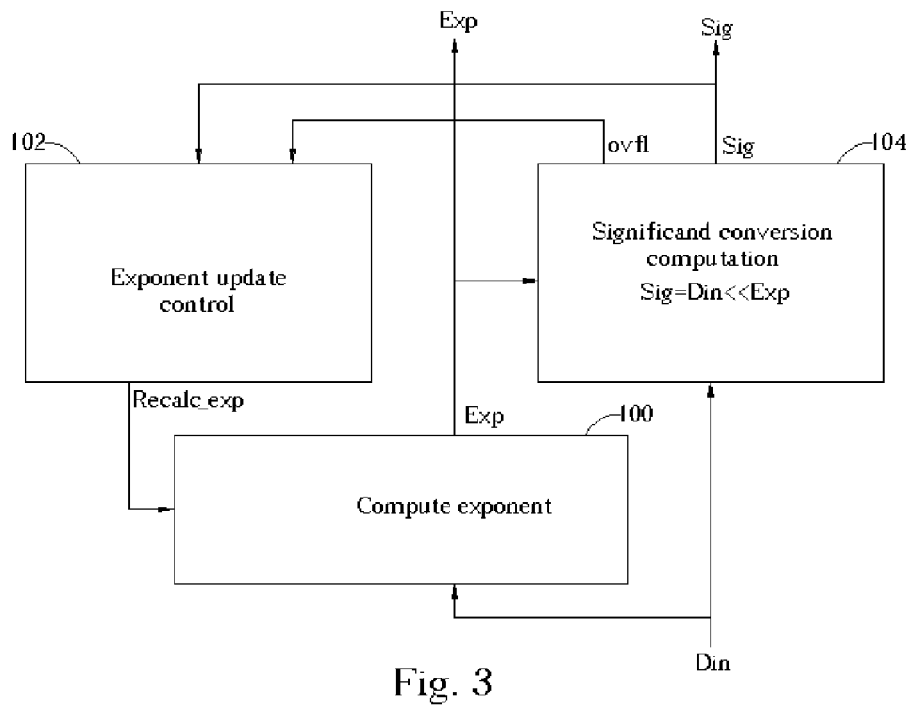
FIG. 3 is a diagram of the integer-to-floating-point conversion.

Please refer to FIG. 3, the block diagram of the integer-to-floating-point converters 90 and 94. The process is identical for both divider control word M 82 and divider control word N 84, so this diagram shows the input as a generic value Din. The integer-to-floating-point converter decomposes a numeric input Din into significand and exponent components Sig and Exp, respectively, where $$Sig = Din \times 2^{Exp} \qquad (eq. 4)$$

Since the typical implementation of a multiply by a power of 2 such as $2^{Exp}$ is easily performed by a shift, (eq. 4) can also be computed using the logical shift operation denoted by $$Sig=Din \times 2^{Exp}=Din<<Exp \quad (eq. 5)$$

where the 'A<<B' operation denotes a bitwise left shift of A by B.

In the preferred embodiment, Din is a 24-bit integer, and Sig has an assumed fixed point format of 4.21 (meaning 4 bits to the left of the decimal point and 21 bits to the right of the decimal point). This assumed format is a notational convenience that simplifies the formulation of (eq. 2) and (eq. 3). Exp is a 5-bit integer enabling a shift of up to 31 bits.

Din is passed to the compute exponent block 100 and the compute significand block 104. The exponent Exp, computed by the Compute exponent block 100 is passed to the output and to the Significand conversion computation block 104. The Significand conversion computation block 104 receives the input signal Din and the exponent signal Exp and outputs the significand Sig and the overflow signal ovfl, where Sig=Din<<Exp, and the overflow signal ovfl is asserted whenever Din<<Exp overflows the internal representation of Sig. The Exponent update control block 102 receives the overflow signal ovfl and Significand Sig from the Significand conversion computation block, and outputs the control signal RECALC_EXP to the Compute exponent block. The Exponent update control block 102 controls the update of the exponent Exp such that small deviations of the significand Sig outside the preferred range are allowed when Din changes over time, reducing the occurrence of changes of the exponent Exp.

Figure 4:
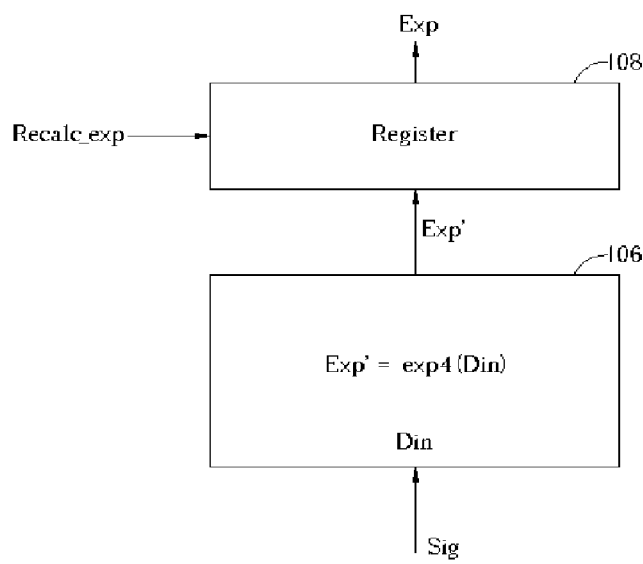
FIG. 4 shows the computation of the floating-point exponent.

The Compute exponent block is shown in more detail in FIG. 4. The temporary exponent value Exp' is computed using the exp4( ) function 106 with argument Din. The exp4( ) function is calculated by determining the number of left-shifts to apply to DIN that would be necessary to bring the significand Sig to within a preferred range. Whenever the signal RECALC_EXP 126 is asserted, the temporary exponent value Exp' is loaded into the register 108 and output as signal Exp.

Figure 6:
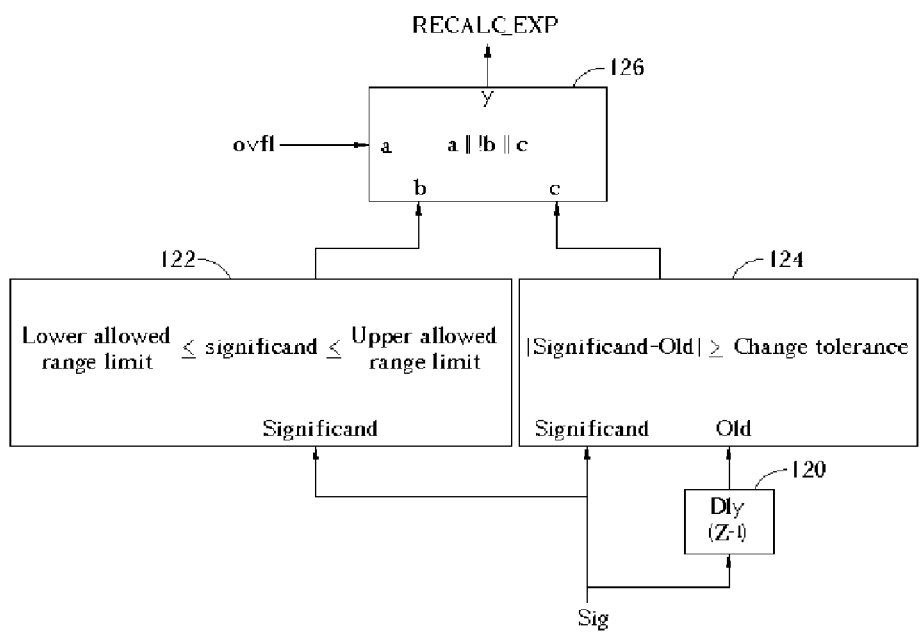
FIG. 6 shows the exponent update control block.

The Exponent update control block is shown in FIG. 6. The signal RECALC_EXP is asserted whenever the significand Sig is outside an allowed range, or changes by more than a change tolerance from the previous cycle, or the ovfl signal is asserted, or the reset signal CLR (not shown) is asserted. The reset signal CLR is asserted whenever the frequency synthesizer is reset to an initial state.

To give a specific example of the integer to floating point conversion, in one embodiment of the invention, the divider control words are input as 24-bit values, and 25-bit registers are used for the floating-point computation. The upper four bits of the floating-point registers are treated as being to the left of the decimal point. The preferred range is chosen to be [4 . . . 8], and the allowed range is chosen as [3.5 . . . 8.5]. A divider value 65503 (base 10), 0000000001111111111011111 (base 2), is left-shifted by 8 bits to produce the significand 0111111111101111100000000 (base 2). For illustration a decimal point is inserted at the assumed point of the 4.21 format resulting in the value 0111.111111101111100000000 (base 2), or 7.9959716796875 (base 10), which is within the preferred range. The exponent Exp calculated is 8 according to the required left shift amount.

Figure 7:
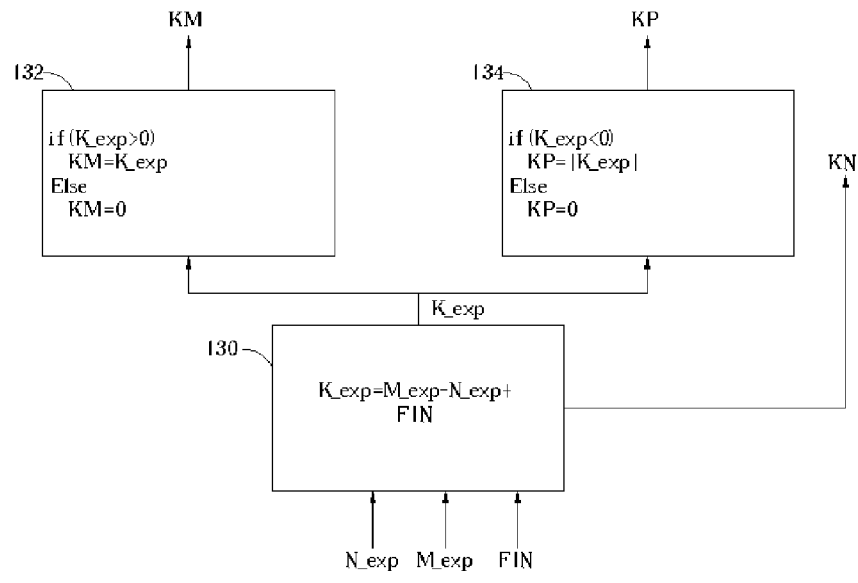
FIG. 7 is a diagram of the floating-point exponent to divider conversion.

Referring to FIG. 7, N_exp is then subtracted from M_exp, and the frequency range indicator exponent value FIN is added to the result to produce an exponent value K_exp. When said value is negative, its absolute value is applied to the output integer divider and zero is applied to the feedback integer divider 132,134. When said value is nonnegative, its value is applied to the feedback integer divider and zero is applied to the output integer divider 132,134. The frequency range indicator exponent value FIN is applied to the input integer divider in all cases. In the preferred embodiment of FIG. 1, the integer divider control values KN, KM, and KP represent power-of-2 divide values (eg. divide value for reference clock integer divider 22 is $2^{KN}$).

Figure 5A:
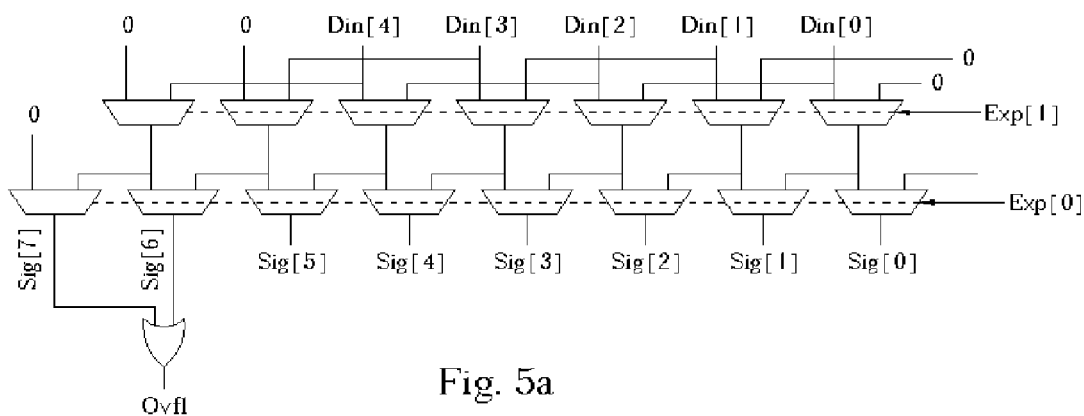
FIG. 5a shows a shift circuit with overflow detection.
Figure 5B:
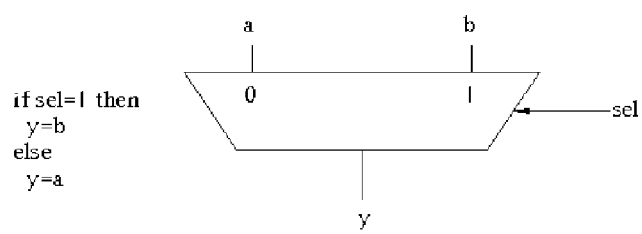
FIG. 5b shows an example one-bit multiplexer.

An example shift circuit in FIG. 5a (simplified to 4-bits input, 5-bits output and left shift from 0–3) shows a circuit for collecting the overflow bits to determine if an overflow has occurred. If the output of the OR gate is 1, the shifted value is too large for the internal 5-bit representation of Sig. The example multiplexer shown in FIG. 5b is a two-input one-bit multiplexer as used in FIG. 5a.

Figure 8:
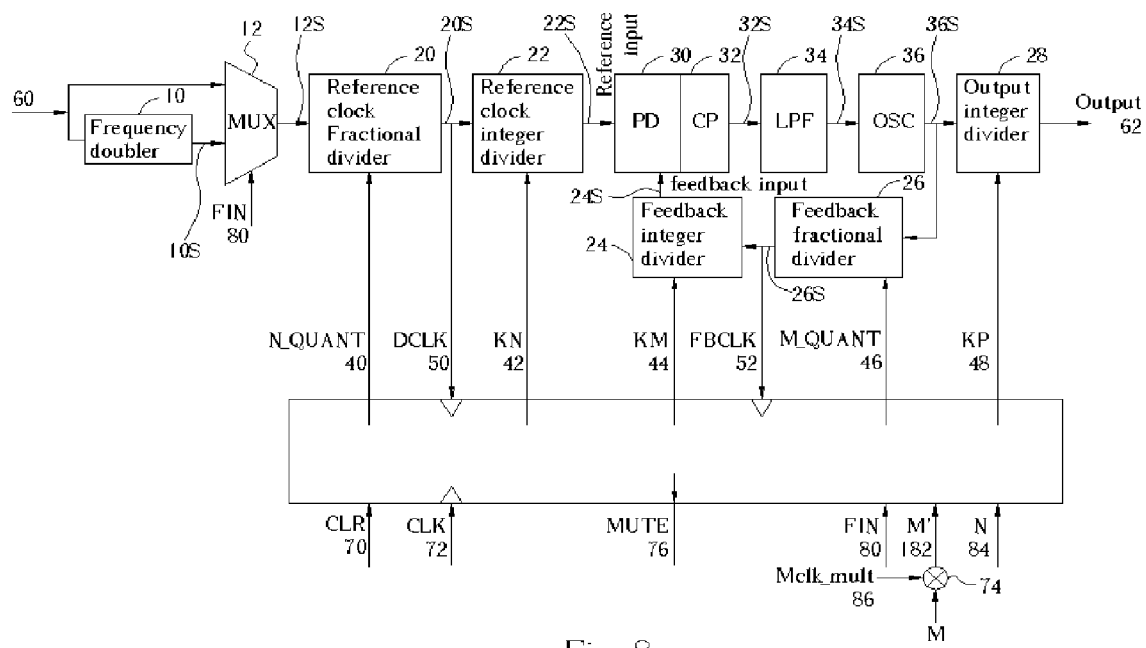
FIG. 8 schematically illustrates a block diagram of a frequency synthesizer in accordance with one preferred embodiment of the present invention as an audio synthesizer.
Figure 9:
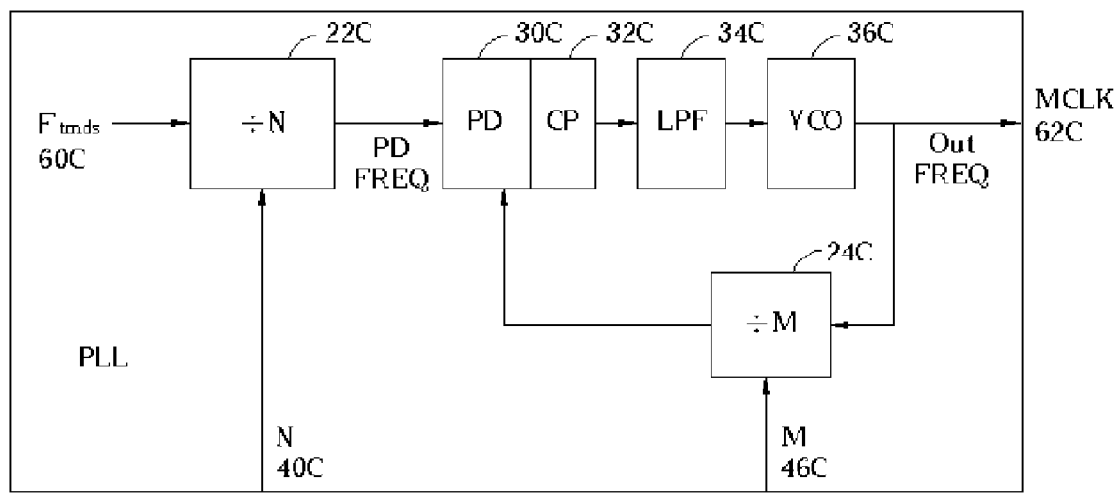
FIG. 9 schematically illustrates a block diagram of a prior-art frequency synthesizer.

To give a concrete example, please refer to FIG. 8, which illustrates a frequency synthesizer in accordance with one preferred embodiment of the present invention as an audio clock synthesizer. The differences between FIG. 8 and FIG. 1 are the addition of a frequency doubler 10, a frequency doubler output signal 10S, a multiplexer 12, a multiplexer output signal 12S, and a multiplier 74. The RECALC_EXP signal 126 is also coupled to the MUTE signal 76, causing the MUTE signal 76 to assert whenever the RECALC_EXP signal 126 is asserted. Since the re-locking time of the synthesizer after an exponent change is approximately known, the audio system can be designed to mute for an appropriate period of time whenever the MUTE signal 76 is asserted.

One embodiment of this invention has 24-bit divider control words, 25-bit floating-point registers, 5-bit exponents, a preferred range of [4 . . . 8], an allowed range of [3.5 . . . 8.5], and a change tolerance of 0.125. The example also has an input clock rate of 27 MHz, a reference frequency divider N of 27000, and a feedback frequency divider M of 6144. In addition the MCLK_MULT 86 value is set to 2. The required output frequency will be $F_{out}$=(M'/N)*$F_{in}$=(2*M/N)*$F_{in}$=27 MHZ*(2*6144/27000)=12.288 Mhz. As the reference frequency of 27 MHz is less than the preferred embodiment's 50 MHz lower limit, the frequency doubler is used to obtain a higher input frequency, and the FIN frequency range indicator exponent value is set to 0.

The feedback frequency divider control word M is multiplied by MCLK_MULT 86, which in the example is 2, to give a divider control word M' 182 value of 12288 (base 10) or 000000000011000000000000 (base 2). When left-shifted by 10 places, the significand value is 6.0.

The reference frequency divider control word N is 27000, or 000000000110100101111000. Left-shifting 9 places gives 6.591796875.

The exponent calculation is K_exp=exp(M)−exp(N)+(FIN−1)=9 −10+(−1)=−2. Since K_exp is negative, KM=0, KP=abs(K_exp)=+2, and KN=FIN=0.

The phase detector input frequency will be 54 MHz/6.591 796875=8.192 MHz.

The VCO 36 output frequency 36S will be the phase detector input frequency multiplied by $2^{KM}$*average (M_QUANT)=8.192 MHz*$2^0$*6.0=49.152 MHz.

The synthesizer output frequency will be the VCO frequency divided by $2^{KP}$, or 49.152 MHz/$2^2$=12.288 MHz, as required.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A frequency synthesizer comprising:
   a phase detector for generating an output according to a difference of a reference input and a feedback input;
   an oscillator coupled to the phase detector, the oscillator capable of outputting a variable frequency signal in response to a control input;
   a first divider module for generating the feedback input, the first divider module comprising a first fractional divider coupled to the oscillator for dividing a frequency of the variable frequency signal by a first time-varying value;
   a second divider module for generating the reference input, the second divider module comprising a second fractional divider for dividing a frequency of a reference signal by a second time-varying value.

2. The frequency synthesizer of claim 1 further comprising a loop filter coupled between the phase detector and the oscillator for removing high frequency components of the output of the phase detector.

3. The frequency synthesizer of claim 1 wherein the oscillator is a voltage-controlled oscillator or a current-controlled oscillator.

4. The frequency synthesizer of claim 1 wherein the first divider module further comprises a first divider coupled to the first fractional divider for dividing a frequency of an output signal of the first fractional divider.

5. The frequency synthesizer of claim 4 wherein the first divider is a first integer divider.

6. The frequency synthesizer of claim 5 wherein the first integer divider is capable of dividing the frequency of the output signal of the first fractional divider by a first integer power of 2.

7. The frequency synthesizer of claim 1 wherein the second divider module further comprises a second divider coupled to the second fractional divider for dividing a frequency of an output signal of the second fractional divider.

8. The frequency synthesizer of claim 7 wherein the second divider is a second integer divider.

9. The frequency synthesizer of claim 8 wherein the second integer divider is capable of dividing the frequency of the output signal of the second fractional divider by a second integer power of 2.

10. The frequency synthesizer of claim 1 further comprising an output divider coupled to the oscillator for dividing the frequency of the variable frequency signal generated by the oscillator.

11. The frequency synthesizer of claim 10 wherein the output divider is an output integer divider.

12. The frequency synthesizer of claim 11 wherein the output integer divider is capable of dividing the frequency of the variable frequency signal generated by the oscillator by a third integer power of 2.

13. The frequency synthesizer of claim 12 wherein the first divider module further comprises a first integer divider coupled to the first fractional divider for dividing a frequency of an output signal of the first fractional divider by a first integer power of 2, the second divider module further comprising a second integer divider coupled to the second fractional divider for dividing a frequency of an output signal of the second fractional divider by a second integer power of 2.

14. The frequency synthesizer of claim 13 further comprising means for calculating the three integer powers of two by subtracting a second exponent value from a first exponent value and adding a first frequency range indicator exponent value for generating a sum.

15. The frequency synthesizer of claim 14 further comprising means for applying the sum to the first integer divider and applying zero to the output integer divider and applying the first frequency range indicator exponent value to the second integer divider when the sum is nonnegative.

16. The frequency synthesizer of claim 14 further comprising means for applying an absolute value of the sum to the output integer divider and applying zero to the first integer divider and applying the first frequency range indicator exponent value to the second integer divider when the sum is negative.

17. The frequency synthesizer of claim 14 further comprising:
    means for determining whether to update the exponent values.

18. The frequency synthesizer of claim 14 further comprising:
    means for generating an exponent value according to the number of left-shifts required to shift a divider control word within a floating-point register until a plurality of bits fall within a preferred range.

19. The frequency synthesizer of claim 14 further comprising:
    means for storing the first exponent value and the second exponent value for subsequent cycles.

20. The frequency synthesizer of claim 14 further comprising:
    means for generating the first frequency range indicator exponent value according to a frequency measurement of the reference signal.

21. The frequency synthesizer of claim 14 further comprising:
    means for generating a first floating-point significand by shifting a first divider control word according to the first exponent value;
    means for generating a second floating-point significand by shifting a second divider control word according to the second exponent value.

22. The frequency synthesizer of claim 21 further comprising means for multiplying the first divider control word by a second frequency range indicator exponent value.

23. The frequency synthesizer of claim 21 further comprising means for checking whether the floating-point significands are within an allowed range.

24. The frequency synthesizer of claim 21 further comprising means for checking whether the floating-point significands differ from the floating-point significands in the previous cycle by more than a change tolerance.

25. The frequency synthesizer of claim 21 further comprising means for checking whether the floating-point significands have overflowed during shifting.

26. The frequency synthesizer of claim 21 further comprising a first quantizer coupled to the first floating-point register for quantizing the first floating-point significand, and a second quantizer coupled to the second floating-point register for quantizing the second floating-point significand.

27. The frequency synthesizer of claim 26 wherein the quantizers are delta-sigma quantizers.

28. The frequency synthesizer of claim 27 wherein the delta-sigma quantizers are of second order.

29. The frequency synthesizer of claim 18 further comprising means for outputting an unlock signal when the exponent values have changed.

30. The frequency synthesizer of claim 29 further comprising means for generating a mute signal in response to the unlock signal.

31. The frequency synthesizer of claim 1 further comprising a frequency doubler for increasing a frequency of an input clock, and a multiplexer having a first input coupled to the input clock and a second input coupled to the output of the frequency doubler and an output coupled to the first fractional divider and a selector input for selecting which input to output to the first fractional divider.

32. The frequency synthesizer of claim 1 wherein the fractional dividers are fractional-N dividers.

33. A method for synthesizing an output signal having a frequency proportional to a frequency of an input signal comprising following steps:
   (a) quantizing a first floating-point significand to generate a first time-varying value and a second floating-point significand to generate a second time-varying value;
   (b) generating an output according to a difference of a reference input and a feedback input;
   (c) outputting the variable frequency signal in response to a control input;
   (d) dividing a frequency of the variable frequency signal by the first time-varying value; and
   (e) dividing a frequency of the reference signal by the second time-varying value.

34. The method of claim 33 further comprising removing high frequency components of the output generated according to the difference of the reference input and the feedback input.

35. The method of claim 33 further comprising step (f): dividing a frequency of an output signal generated by dividing the frequency of the variable frequency signal.

36. The method of claim 35 wherein step (f) is performed by dividing the frequency of the output signal by a first integer power of 2.

37. The method of claim 33 further comprising step (g): dividing a frequency of an output signal generated by dividing the frequency of the reference signal.

38. The method of claim 37 wherein step (g) is performed by dividing the frequency of the output signal by a second integer power of 2.

39. The method of claim 33 further comprising step (h): dividing the frequency of the variable frequency signal to generate the synthesized output signal.

40. The method of claim 39 wherein step (h) is performed by dividing the frequency of the variable frequency signal by a third integer power of 2.

41. The method of claim 40 further comprising following steps:
   (f) dividing a frequency of an output signal generated by dividing the frequency of the variable frequency signal by a first integer power of 2; and
   (g) dividing a frequency of an output signal generated by dividing the frequency of the reference signal by a second integer power of 2.

42. The method of claim 41 further comprising calculating the three integer powers of two by subtracting a second exponent value from a first exponent value and adding a first frequency range indicator exponent value for generating a sum.

43. The method of claim 42 further comprising applying the sum to the first integer power, applying zero to the third integer power, and applying the first frequency range indicator exponent value to the second integer power when the sum is nonnegative.

44. The method of claim 42 further comprising applying an absolute value of the sum to the third integer power, applying zero to the first integer power, and applying the first frequency range indicator exponent value to the second integer power when the sum is negative.

45. The method of claim 42 further comprising determining whether to update the exponent values.

46. The method of claim 42 further comprising generating an exponent value according to the number of left-shifts required to shift a divider control word until a plurality of bits fall within a preferred range.

47. The method of claim 42 further comprising storing the first exponent value and the second exponent value for subsequent cycles.

48. The method of claim 42 further comprising generating the first frequency range indicator exponent value according to a current frequency measurement of the reference signal.

49. The method of claim 42 further comprising:
   generating the first floating-point significand by shifting a first divider control word according to the first exponent value; and
   generating the second floating-point significand by shifting a second divider control word according to the second exponent value.

50. The method of claim 49 further comprising multiplying the first divider control word by a second frequency range indicator exponent value.

51. The method of claim 49 further comprising checking whether the floating-point significands are within an allowed range.

52. The method of claim 49 further comprising checking whether the floating-point significands differ from the floating-point significands in the previous cycle by more than a change tolerance.

53. The method of claim 49 further comprising checking whether the floating-point significands have overflowed during shifting.

54. The method of claim 46 further comprising outputting an unlock signal when the exponent values are being recalculated.

55. The method of claim 54 further comprising generating a mute signal in response to the unlock signal.

56. The method of claim 33 further comprising increasing a frequency of an input clock, and selecting the input clock or the input clock with increased frequency to apply as the reference input.

* * * * *